United States Patent
Lenhard et al.

(10) Patent No.: US 6,788,046 B2
(45) Date of Patent: Sep. 7, 2004

(54) COMPENSATION CURRENT SENSOR

(75) Inventors: Friedrich Lenhard, Hanau (DE); Stefan Schäfer, Rummelsheim (DE)

(73) Assignee: Vacuumschmelze GmbH & Co., KG, Hanau (DE)

( * ) Notice: Subject to any disclaimer, the term of this patent is extended or adjusted under 35 U.S.C. 154(b) by 0 days.

(21) Appl. No.: 10/182,163

(22) PCT Filed: Jan. 26, 2001

(86) PCT No.: PCT/EP01/00859
§ 371 (c)(1),
(2), (4) Date: Nov. 21, 2002

(87) PCT Pub. No.: WO01/55734
PCT Pub. Date: Aug. 2, 2001

(65) Prior Publication Data
US 2003/0160601 A1 Aug. 28, 2003

(30) Foreign Application Priority Data
Jan. 28, 2000 (DE) ......................... 100 03 638

(51) Int. Cl.⁷ ............................................. G01R 33/00
(52) U.S. Cl. ............................. 324/117 R; 324/117 H; 324/158.1
(58) Field of Search ................. 324/765, 117 H, 324/117 R, 158.1, 126, 127, 251, 252, 115, 522, 547; 338/32 H; 330/8; 307/416

(56) References Cited
U.S. PATENT DOCUMENTS

| | | | |
|---|---|---|---|
| 5,523,677 A | * 6/1996 | Kawakami et al. | 324/117 R |
| 5,565,765 A | 10/1996 | Lenhard | |
| 5,764,123 A | 6/1998 | Waters | |
| 5,767,667 A | * 6/1998 | Shafie | 324/117 R |
| 5,793,196 A | * 8/1998 | White | 324/127 |
| 5,828,282 A | 10/1998 | Tiemann | |
| 6,144,196 A | * 11/2000 | Tamaki | 324/117 R |
| 6,441,605 B1 | * 8/2002 | Baurand et al. | 324/127 |
| 6,525,524 B2 | * 2/2003 | Lancaster et al. | 324/117 H |
| 6,563,296 B2 | * 5/2003 | Cooke | 324/127 |

FOREIGN PATENT DOCUMENTS

| | | |
|---|---|---|
| DE | 38 35 101 A | 8/1990 |
| DE | 295 06 883 U1 | 6/1995 |
| DE | 295 20 066 U1 | 4/1996 |
| DE | 44 23 429 A1 | 10/1996 |
| EP | A 0 556 009 | 8/1993 |
| WO | WO 98/52052 | 11/1998 |

OTHER PUBLICATIONS

English–language translation of German Patent Document No. 29520066.

* cited by examiner

Primary Examiner—Kamand Cuneo
Assistant Examiner—Jimmy Nguyen
(74) Attorney, Agent, or Firm—Dean W. Russell; Kilpatrick Stockton LLP

(57) ABSTRACT

The invention relates to a compensation current sensor, comprising a magnet core (M4), with a first section around which a secondary winding (S4) is wound. A magnetic field probe (MS4) is arranged in the vicinity of the secondary winding (S4). A primary winding is magnetically coupled with the secondary winding (S4). A metal screen (A4) is provided at a distance from the magnet core (M4). On the plane, on which the magnet core (M4) lies, the shield (A4) surrounds the magnet core (M4), with the exception of a side opening, whereby part of the opening is in the vicinity of the magnetic field probe (MS4) and arranged and configured such that magnetic flux which passes through the shield (A4), partially passes through the magnetic field probe (MS4).

5 Claims, 4 Drawing Sheets

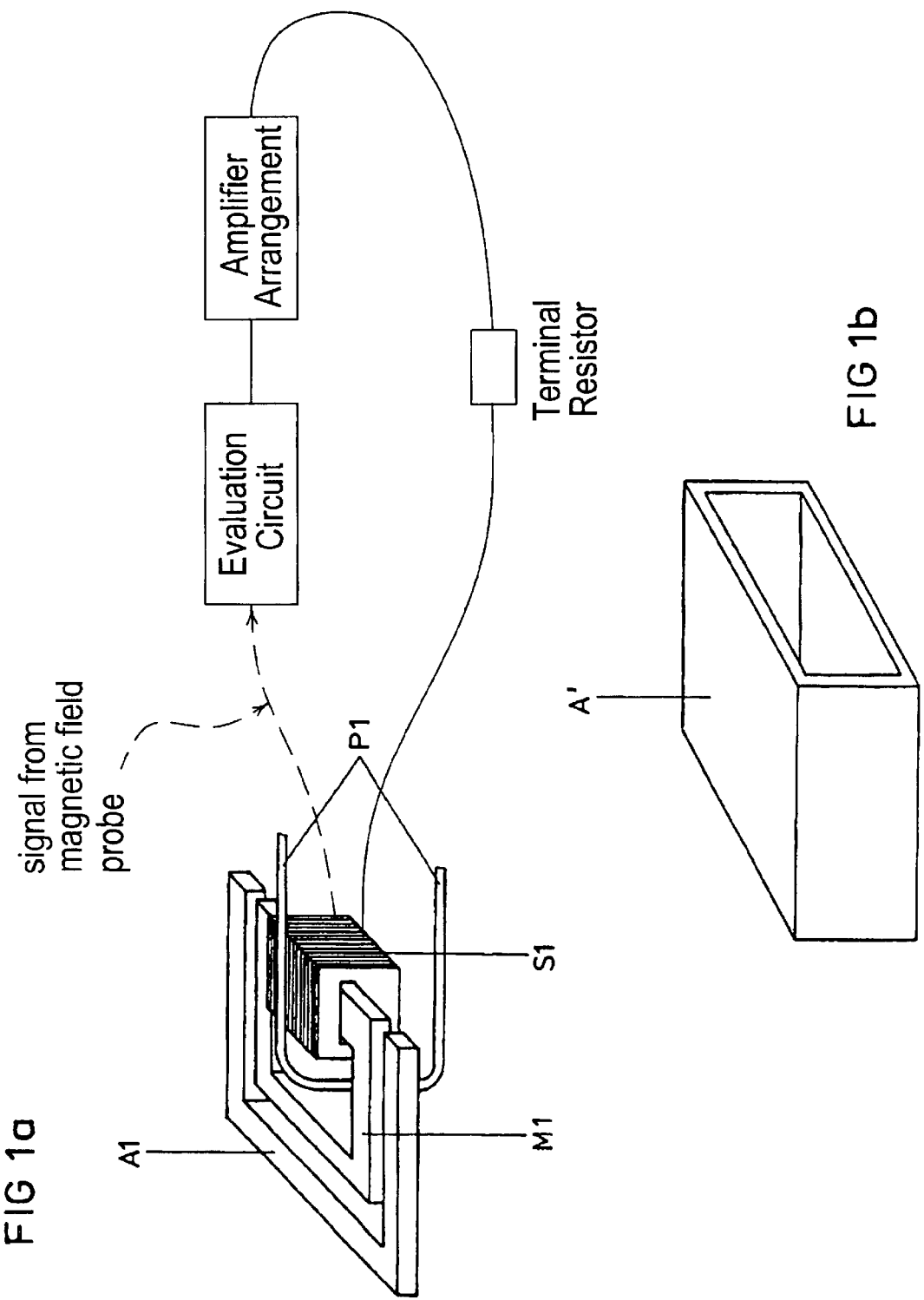

COMPENSATION CURRENT SENSOR

This application claims priority to German Application No. 100.03.638.4 filed on Jan. 28, 2000 and International Application No. PCT/EP01/00859 filed on Jan. 26, 2001, the entire contents of which are incorporated herein by reference.

The invention relates to a compensation current sensor, in particular for the measurement of DC and AC currents, in which the magnetic field, generated in a magnet core by a primary winding through which flows the current to be measured, is compensated by the compensation current in a secondary winding, wherein, to control the compensation current, at least one magnetic field probe affected by the magnetic field records deviations from zero flux and supplies this measured value via an evaluation circuit to an amplifier arrangement to generate the compensation current while, at the output of the amplifier arrangement, the secondary winding is connected in series to a terminating resistor so that a voltage proportional to the current to be measured is present at the terminating resistor.

Such compensation current sensors are known, for example, from DE 44 23 429 A1, DE 295 06 883 U1, and DE 295 20 066 U1. Their functional principle is described there in detail.

The greater the current through the primary winding, said current to be measured, is, the greater the magnetic flux generated by this current is and the greater the section-wise magnetization of the magnet core which arises through the leakage flux. The leakage flux is the magnetic flux which penetrates the magnet core only partially. However, the proportionality between the current through the primary winding and the current through the secondary winding ends if the current is so great that the saturation magnetization of the magnet core is reached by the leakage flux in a section of the magnet core. Therefore, the measurement range of the current sensor is restricted by the saturation magnetization of the magnet core.

The greater the core cross-section of the magnet core is, the greater the current to be measured is through which the saturation magnetization of the magnet core is reached, that is, the greater the measurement range is. However, to reduce the production costs and the size of the current sensors, the smallest possible core cross-sections of the magnet core are strived for.

The objective of the invention is to improve compensation current sensors of the class stated initially with the aim of significantly expanding their measurement range without the magnet cores, and thus the outer dimensions, being noticeably increased.

The objective is realized by a compensation current sensor of the class stated initially which is characterized by the fact that means are provided which couple a part of the primary winding's magnetic flux, which is not coupled into the magnet core, into the compensation apparatus formed by the secondary winding and magnetic field probe and simultaneously back-couple the magnetic leakage flux of the secondary winding into the compensation apparatus. Through the inclusion of these two magnetic fluxes in the measurement, the measurement range can be dramatically increased without increasing the structural volume of the compensation current sensor.

Typically as means, metallic shields are provided which encircle the magnet core, lie in a plane with the magnet core, and have an opening in the area of the compensation apparatus so that the part of the magnetic flux of the primary winding is coupled into the compensation apparatus formed by the secondary winding and magnetic field probe and simultaneously the magnetic leakage flux of the secondary winding is back-coupled into the compensation apparatus.

In the case of the present compensation current sensor, the magnet core has a first section around which at least a part of a secondary winding is wound. A magnetic field probe is disposed in the area of this first section. The secondary winding and the magnetic field probe form the actual compensation apparatus of the compensation current sensor.

A primary winding is magnetically coupled to the secondary winding via the magnet core, where a part of the magnetic flux carried by the primary winding does not couple into the magnet core.

In a typical development of the present invention the means have the structure of a metallic shield which is at a distance from the magnet core and lies in a plane in which the magnet core lies. This shield encircles the magnet core up to a lateral opening in the area of the compensation apparatus where the magnetic flux penetrating the shield, which is composed of the magnetic flux stemming from the primary winding and the leakage flux stemming from the secondary winding, is coupled into the magnetic field probe.

The shield described above prevents in addition an increased sensitivity to external magnetic fields. Surprisingly, the shield does not only cause a reduced sensitivity to interference magnetic fields but rather it clearly expands the measurement range by the above-described coupling of the magnetic flux. The insight underlying the invention is that the shield accepts a part of the leakage flux so that a second section of the magnet core unloaded thereby only goes into saturation at higher currents. The shield acts as an additional magnet core with an air gap which is defined by the distance between the magnet core and the shield.

The close coupling between the windings is partially eliminated once more by the lines to the windings. Furthermore, for reasons of construction, an optimal coupling between the windings is only possible to a restricted extent. Through the elimination of the close coupling the second section becomes magnetized and thus the characteristic curve becomes nonlinear since the second section is not disposed in the vicinity of the magnetic probe and therefore its magnetization is not necessarily compensated to zero. However, due to the shield the magnetization is only done at significantly higher currents than without a shield. A better shield against external magnetic fields can in fact be obtained if the opening of the shield is disposed in the area of the second section, since the magnetic probe is more effectively shielded. However, it has been shown that in this case the measurement range is sharply reduced. This is due to the fact that the magnetic flux which is generated by the primary winding is supplied to the second section amplified through the shield so that the saturation magnetization is even reached at very small currents.

The magnet core can be completely closed in itself or, for example, have a gap in the area of the magnetic field probe. The magnet core is bent in the plane in which the magnet core lies.

The magnet core can, for example, be a toroidal core. The magnet core can also, for example, consist of two band sections which are formed by multiple folding of the band, which is described, for example, in WO 98/52052.

The shield is at a distance from the magnet core so that the shield acts as a shield. The distance is, for example, several millimeters.

Preferably the primary winding is guided around the secondary winding. Therefore, in this case the primary winding and the secondary winding are disposed on the same leg of the magnet core so that a closer magnetic coupling of the two windings is obtained and a significantly smaller core cross-section of the magnet core is needed, which clearly reduces the production costs of the compensation current sensor. Preferably, the core cross-section of the magnet core is smaller in the second section than in the first section. Through the smaller core cross-section the production costs can be reduced. Due to the small core cross-section the magnet core can be implemented as a massive part without too strong eddy currents occurring. In the area of the magnetic field probe a greater core cross-section can be advantageous in order to prevent interference magnetic fields from penetrating into the magnetic field probe.

The shield can, for example, be U-shaped. In this case, the opening of the shield extends along the entire first section. Since, outside of the plane in which the magnet core lies, no shield is provided, the compensation current sensor has a particularly small size.

Alternatively, the opening can be smaller so that a part of the shield runs along the first section.

The shield can also be disposed partially outside of the plane in which the magnet core lies. For example, the shield has the form of an open cylinder with a base. The shield is therefore beaker-like. Also in this case the opening of the shield can extend along the entire first section. "Cylinder" is the designation for a body which is bounded by two parallel planes and one surface which arises through parallel displacement of a line along a three-dimensional curve. The three-dimensional curve does not absolutely have to be a circle, that is, the cylinder does not absolutely have to be a circular cylinder.

The shield preferably consists of a highly permeable material. For example, the shield consists of nickel iron.

It is within the scope of the invention to provide more than one part of the secondary winding. The parts of the secondary winding are wound around sections of the magnet core at a distance from one another.

The magnetic field probe is preferably disposed within the secondary winding. However, it can also be disposed next to the secondary winding but in the vicinity of the first section of the magnet core. The magnetic field probe can, for example, be disposed between two parts of the secondary winding at a distance from one another.

In the following, embodiment examples of the invention are described in more detail with the aid of the figures.

BRIEF DESCRIPTION OF DRAWING

FIG. 1a shows in schematic representation a perspective view of a transformer of a first compensation current sensor with a first magnet core, a first primary winding, a first secondary winding, and a first shield.

FIG. 1b shows in schematic representation a perspective view of an additional shield.

All the embodiment examples shown in the figures show compensation current sensors which have been provided with metallic shields. However, let reference be made to the fact that along with the metallic shields other developments are also possible in which other means are used to couple the magnetic flux from the primary winding and the leakage flux from the secondary winding effectively into the compensation apparatus, in particular into the magnetic field probe.

It is not shown in the embodiment examples and also not discussed in the following, how the measured values generated by the magnetic field probe are supplied via an evaluation circuit to an amplifier arrangement to generate the compensation current while, at the output of the amplifier arrangement, the secondary winding is connected in series to a terminating resistor so that a voltage proportional to the current to be measured is present at the terminating resistor, since, on the one hand, this is not necessary to understand the present invention and, on the other hand, has been known for a long time. For this, we refer to the DE 44 23 429 A1 mentioned initially.

In a first embodiment example, the first compensation current sensor has a transformer which has a rectangular first magnet core M1. The magnet core M1 has a first section around which a first secondary winding S1 is wound (see FIG. 1a). Within the first secondary winding S1 a magnetic field probe (not represented) is disposed. Opposite the first section a second, unwound section of the first magnet core M1 is disposed. The core cross-section M1 is generally ca. 2 mm². The dimensions of the first magnet core M1 are 20 mm and 14 mm.

A first primary winding P1 is a guided around the first secondary winding S1 (see FIG. 1a). Magnetic field lines of a magnetic field, which is generated by the current to be measured which flows through the first primary winding P1, run partially along the first magnet core M1 through the second section.

A U-shaped first shield A1, which is at a distance from the first magnet core M1, is disposed in such a way that the opening of the first shield A1, which is disposed between the two ends of the first shield A1, extends along the first section. The spacing between the first magnet core M1 and the first shield A1 is ca. 4 mm. The first shield A1 consists of nickel iron.

Instead of the U-shaped first shield A1 a beaker-like shield A1' can be provided which has the form of an open cylinder with a base. For the sake of clarity only the beaker-like shield A1' is represented in FIG. 1b.

Figure 1C:
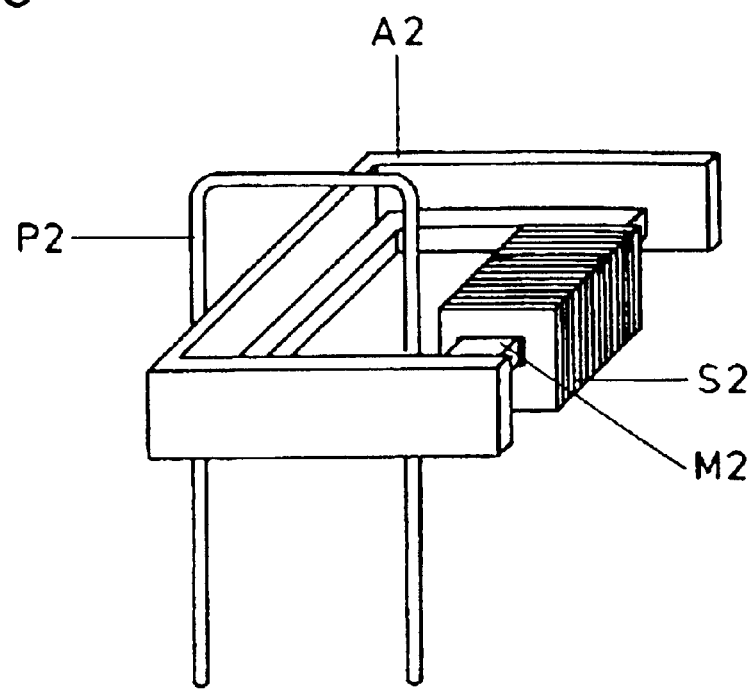
FIG. 1c shows in schematic representation a perspective view of a transformer of a second compensation current sensor with a second magnet core, a second primary winding, a second secondary winding, and a second shield.

In a second embodiment example a second compensation current sensor is provided which has a second magnet core M2, a second secondary winding S2, and a second magnetic field probe (not represented) which are configured as in the first embodiment example (see FIG. 1c).

As in the first embodiment example a second shield A2 is provided which has, in comparison to the first embodiment example, a greater dimension perpendicular to the plane in which the second magnet core M2 lies.

A second primary winding P2 is guided around a second section of the second magnet core M2 and around the second shield A2. The second section of the second magnet core M2 lies opposite the first section of the second magnet core M2 around which the second secondary winding S2 is wound.

Figure 1D:
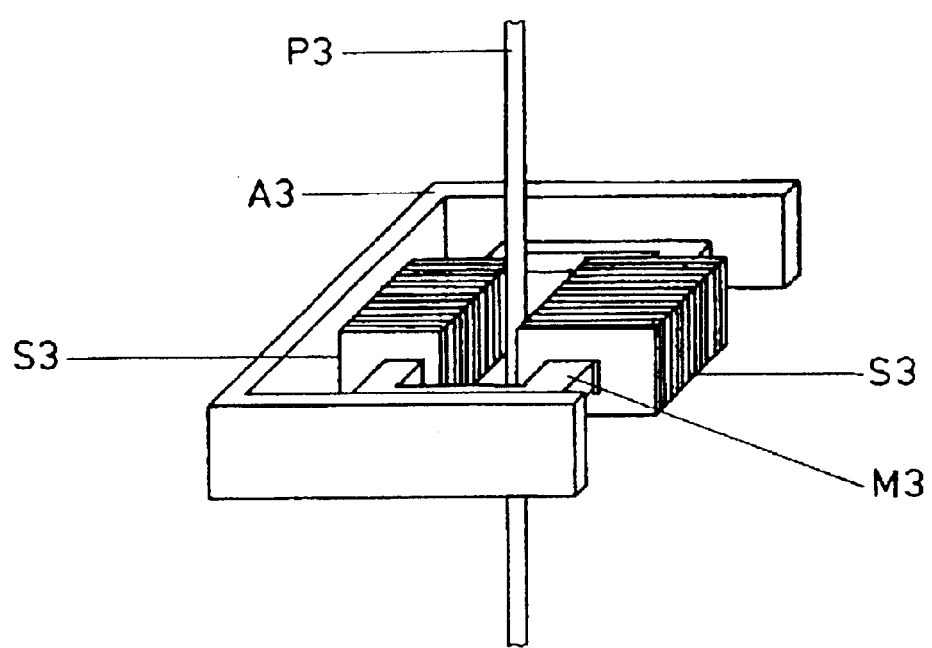
FIG. 1d shows in schematic representation a perspective view of a transformer of a third compensation current sensor with a third magnet core, a third primary winding, a third secondary winding, and a third shield.

In a third embodiment example a third compensation current sensor is provided which has a third magnet core M3 and a third shield A3 which are configured as in the second embodiment example (see FIG. 1d).

A third primary winding P3 is configured as a straight conductor and guided through the center of the third magnet core M3.

A third secondary winding S3 has two parts. The first part of the secondary winding S3 is wound around a first section of the third magnet core M3 along which the opening of the third shield A3 extends. Within the first part of the third secondary winding S3 a third magnetic field probe (not represented) is disposed. The second part of the third secondary winding S3 is wound around a second section of the third magnet core M3 which lies opposite the first section.

In a fourth embodiment example a fourth compensation current sensor is provided which has a fourth magnet core M4. The fourth magnet core M4 consists of multiply bent thick bands. The bending in the area of a first section of the fourth magnet core M4 serves to enlarge the effective core cross-section of the fourth magnet core M2 in the area of a first section. This effective core cross-section is ca. 6 mm².

Figure 2:
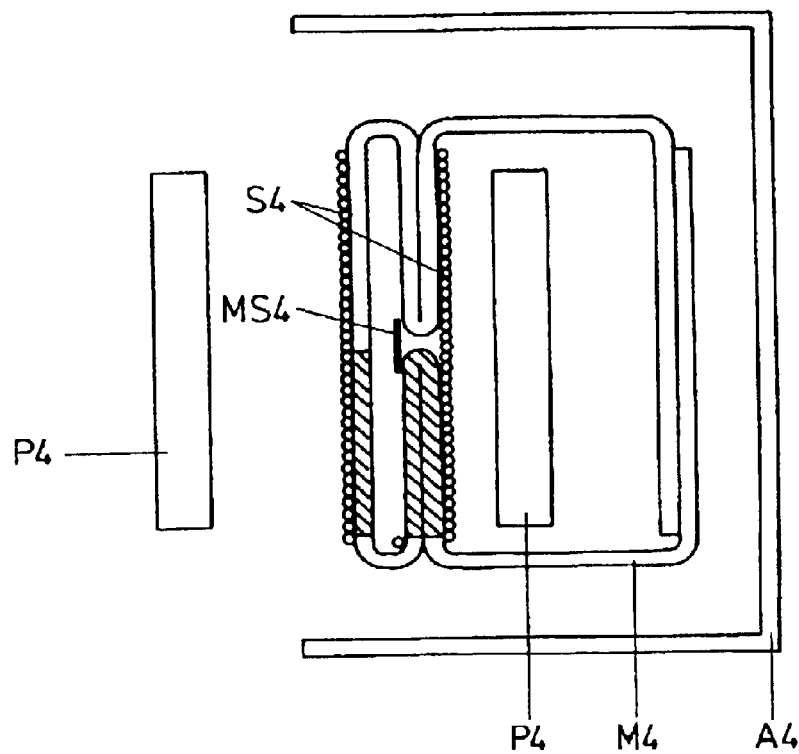
FIG. 2 shows a cross-section through a transformer of a fourth compensation current sensor with a fourth magnet core, a fourth primary winding, a fourth secondary winding, a fourth magnetic field probe, and a fourth shield.

A fourth secondary winding S4 is guided around the first section (see FIG. 2). Within the fourth secondary winding S4 a fourth magnetic field probe MS4 is disposed. A fourth primary winding P4 is a guided around the fourth secondary winding S4. Opposite the first section a second section of the fourth magnet core M4 is disposed whose core cross-section is ca. 2 mm².

A U-shaped fourth shield A4 is disposed in such a way that its opening extends along the first section (see FIG. 2).

Figure 3:
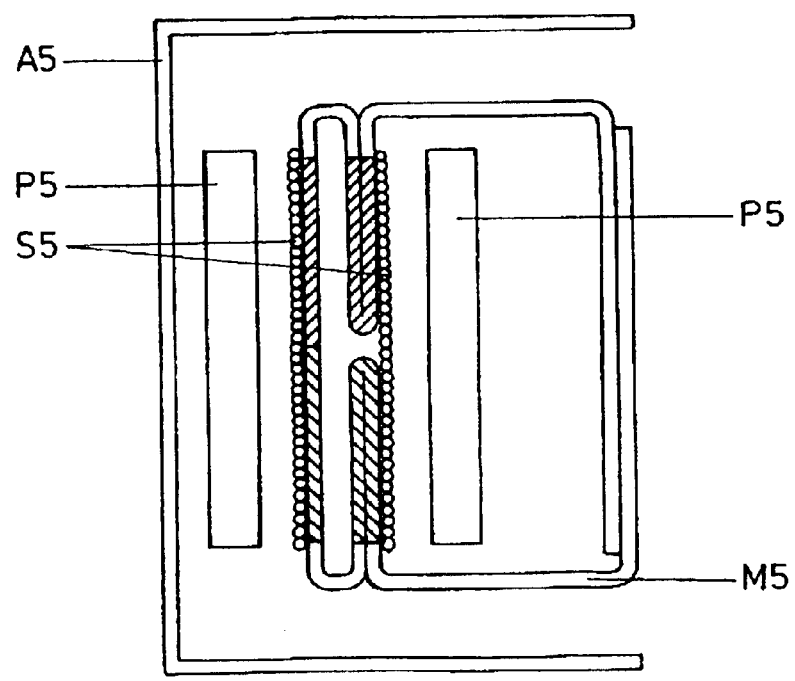
FIG. 3 shows a cross-section through a compensation current sensor not according to the invention with a fifth magnet core, a fifth primary winding, a fifth secondary winding, a fifth magnetic field probe, and a fifth shield.

A fifth compensation current sensor not according to the invention has a fifth magnet core M5, a fifth primary winding P5, a fifth magnetic field probe MS5, and a fifth secondary winding S5 which are disposed analogously to the fourth embodiment example (see FIG. 3). Unlike the fourth embodiment example, a U-shaped fifth shield A5 is disposed so that its opening extends along the second section of the fifth magnet core M5.

Figure 4:
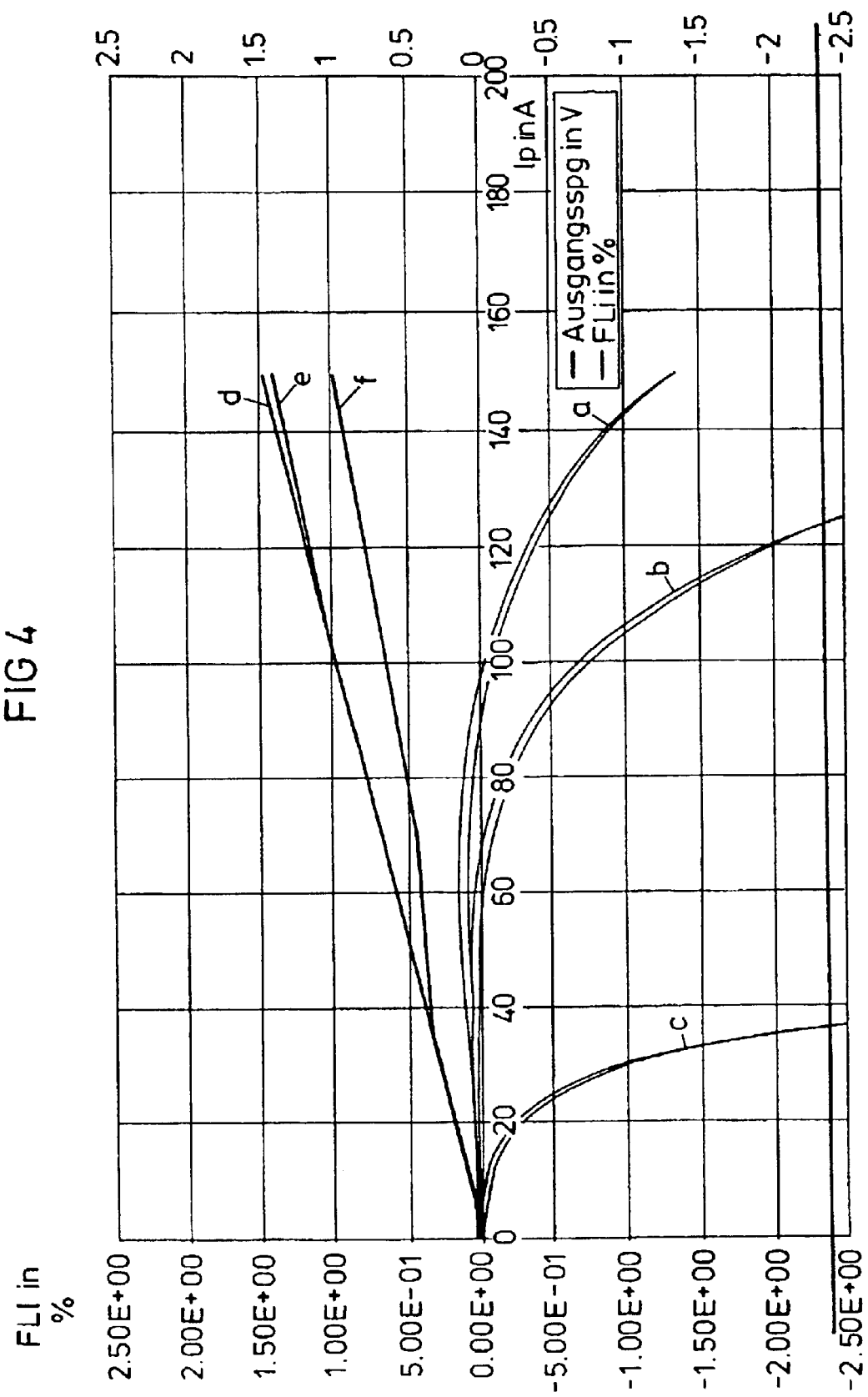
FIG. 4 shows the measurement error as a function of the current to be measured and the voltage at the secondary winding as a function of the current to be measured.

FIG. 4 shows the measurement error as a function of the current to be measured which flows through the primary winding for a compensation current sensor according to the fourth embodiment example, for the compensation current sensor according to FIG. 3 but not according to the invention, and for an additional compensation current sensor not according to the invention, said compensation current sensor being designed analogously to the compensation current sensor of the fourth embodiment example but without a shield. Curve a shows the function for the compensation current sensor according to the fourth embodiment example. Curve b shows the function for the compensation current sensor without a shield. Curve c shows the function for the compensation current sensor according to FIG. 3.

From FIG. 4 it can be concluded that the measurement range of the compensation current sensor according to the invention is significantly greater than that of the compensation current sensor represented in FIG. 3 but not according to the invention and than that of the compensation current sensor without a shield.

Furthermore, FIG. 4 shows the voltage at the secondary winding as a function of the current to be measured for the compensation current sensor according to the invention of the fourth embodiment example, for the compensation current sensor according to FIG. 3 but not according to the invention, and for the compensation current sensor not according to the invention, said compensation current sensor being designed analogously to the second compensation current sensor but without a shield. Curve d shows the function for the compensation current sensor according to the fourth embodiment example. Curve e shows the function for the compensation current sensor without a shield. Curve f shows the function for the compensation current sensor according to FIG. 3.

From FIG. 4 it can be concluded that the linearity of the characteristic curve of the current sensor according to the invention is significantly better than that of the compensation current sensor represented in FIG. 3 but not according to the invention and than that of the compensation current sensor without a shield.

What is claimed is:

1. A compensation current sensor in which the magnetic field, generated in a magnet core by a primary winding through which flows the current to be measured, is compensated by the compensation current in a secondary winding, wherein, to control the compensation current, at least one magnetic field probe affected by the magnetic field and located in the area of the secondary winding records deviations from zero flux and supplies this measured value via an evaluation circuit to an amplifier arrangement to generate the compensation current while, at the output of the amplifier arrangement, the secondary winding is connected in series to a terminating resistor so that a voltage proportional to the current to be measured is present at the terminating resistor wherein means are provided which couple a part of the magnetic flux of the primary winding, said magnetic flux not coupled into the magnet core, into the compensation apparatus formed by the secondary winding and magnetic field probe and simultaneously back-couple the magnetic leakage flux of the secondary winding into the compensation apparatus and that the core cross-section of the magnet core is greater in a first section located in the area of the compensation apparatus than in a second section of the magnet core.

2. The compensation current sensor according to claim 1 wherein a metallic shield is provided which encircles the magnet core, lies in a plane with the magnet vote, and has an opening in the area of the compensation apparatus so that the part of the magnetic flux of the primary winding is coupled into the compensation apparatus formed by the secondary winding and magnetic field probe end simultaneously the magnetic leakage flux of the secondary winding is back-coupled into the compensation apparatus.

3. The compensation current sensor according to claim 2 wherein the shield is U-shaped and that the opening of the shield extends along the entire first section.

4. The compensation current sensor according to claim 2 wherein the shield has the form of an open cylinder with a base and that the opening of the shield extends along the entire first section.

5. The compensation current sensor according to claim 1 wherein the primary winding is guided around the secondary winding and is electrically insulated from the secondary winding.

* * * * *